United States Patent
Cho

(10) Patent No.: US 7,376,044 B2
(45) Date of Patent: May 20, 2008

(54) BURST READ CIRCUIT IN SEMICONDUCTOR MEMORY DEVICE AND BURST DATA READ METHOD THEREOF

(75) Inventor: Ji-Ho Cho, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/591,580

(22) Filed: Nov. 2, 2006

(65) Prior Publication Data

US 2007/0189074 A1    Aug. 16, 2007

(30) Foreign Application Priority Data

Feb. 15, 2006    (KR) .................. 10-2006-0014783

(51) Int. Cl.
    *G11C 8/00*    (2006.01)
(52) U.S. Cl. ............... 365/233; 365/189.05; 365/233.5
(58) Field of Classification Search ................ 365/233, 365/189.05, 230.03, 233.5, 185.21, 185.33; 711/167, E12.083
    See application file for complete search history.

(56) References Cited

U.S. PATENT DOCUMENTS 6,381,180 B1 *   4/2002   Merritt et al. ......... 365/189.05
6,775,718 B2     8/2004   Saruwatari et al.
2005/0117446 A1  6/2005   Shimbayashi

FOREIGN PATENT DOCUMENTS

| JP | 10144071      | 5/1998  |
| JP | 11149770      | 6/1999  |
| JP | 11213663      | 8/1999  |
| JP | 2002-28817    | 10/2002 |
| JP | 2004-206832   | 7/2004  |
| JP | 2005-092957   | 4/2005  |
| KR | 1020030025319 A | 3/2003 |
| KR | 1020050027957 | 3/2005  |

\* cited by examiner

*Primary Examiner*—David Lam
(74) *Attorney, Agent, or Firm*—Volentine & Whitt, PLLC

(57) ABSTRACT

A semiconductor memory device conducts a burst read operation that avoids interrupt loading on a system. The memory device includes a memory cell array, a sense amplifier, a latch circuit and a burst mode control unit. The sense amplifier is configured to sequentially sense and amplifies data stored in the memory cell array. The latch circuit is configured for latching sensed data of the sense amplifier group and outputting the sensed data in response to a DUMP signal. The burst mode control unit is configured for detecting the length of invalid data included in the sensed data from a burst start address and controlling a point in time of DUMP signal generation according to the detection result to sequentially output only valid data among the sensed data.

16 Claims, 7 Drawing Sheets

BURST READ CIRCUIT IN SEMICONDUCTOR MEMORY DEVICE AND BURST DATA READ METHOD THEREOF

BACKGROUND OF THE INVENTION

1. Field of the Invention

The present invention relates to semiconductor memory devices and, more specifically, to flash memory devices supporting a successive burst read mode.

This U.S non-provisional patent application claims priority under 35 U.S.C § 119 of Korean Patent Application 2006-14783 filed on Feb. 15, 2006, the entirety of which is hereby incorporated by reference.

2. Discussion of Related Art

Flash memory is a type of nonvolatile rewritable memory useful in a wide variety of data applications that require occasional writing and/or rewriting of data, nonvolatile storage, and relatively high-speed read capability. To increase the read speed, some flash memory devices include a "burst-read" or "page-read" operation. A flash memory device with this capability responds to a read request by reading a "page" of memory.

Flash memory devices may be classified into NAND-type flash memory devices (hereinafter referred to as "NAND flash memory devices") and NOR-type flash memory devices (hereinafter referred to as "NOR flash memory devices"). A cell array of a NOR flash memory device is configured as a plurality of memory cells connected in parallel to one bitline, while a NAND flash memory device is configured in which a plurality of memory cells are connected in series to one bitline. Since NOR flash memory devices have much higher operation speed than NAND flash memory devices, they are being used in a variety of applications requiring high-speed characteristic.

A read operation is conducted similarly to a random access operation. An external system inputs a specific address, on a memory cell array, where data to be read is positioned and inputs a read command. Thereafter, if an output enable signal is activated, it is synchronized with a clock signal from the system to output data corresponding to the input address. However NOR flash memory devices support a burst read mode, which is suitable for supporting a high-speed read operation. In the burst read mode, data larger than an input/output unit (I/O configuration: for example, ×16 structure) are output as many as the number of clocks corresponding to a burst length (hereinafter referred to as "BL") by once input of an address and a command in synchronization with a clock signal. Particularly in the burst read mode, all memory cells connected to a specific wordline may be sensed and output sequentially after being selected. Alternatively, in the case where a plurality of wordlines is selected, data of all cells connected to the wordlines may be successively output to the exterior after being sensed sequentially. For such a burst read operation, a memory device receives a start address of a cell array. Thereafter, burst addresses are internally generated using a count-up method to be successively supplied to a read circuit. Accordingly, the system has only to supply addresses once in the burst read mode.

Sense amplifier groups corresponding to the number of words (1 word=16 bits) to be output per sector are needed to support a burst read mode. Due to an operation characteristic of a column gate circuit selecting the sense amplifier groups and bitlines of a cell array, a start address group of the burst read mode is addressed. In case of a memory including a sense amplifier corresponding to four words per sector, a start address group may be categorized as four kinds such as, for example, 4N, 4N+1, 4N+2, and 4N+3. The start address group includes information on the number of valid words among initially output 4-word data. In a burst read mode where cell data should be sensed and output successively, if a start address is positioned at the final stage of a selected wordline, time is required for selecting and accessing a new wordline. Thus, the initially output 4-word data includes not only valid data corresponding to an assigned address but also invalid data for outputting data that are continuous for an extra time when access is conducted to the next wordline. A word boundary means a period corresponding to invalid data among four words output initially. A memory device informs a system that a word boundary is invalid data included in initially output 4-word data, through a ready pin (RDY pin). Generally, an output of a ready pin (RDY pin) is a ready signal RDY where a burst read mode starts. The ready signal RDY transitions to a low level during an initial read period. The ready signal RDY is output high during a period where effective data is output at words (e.g., four words) corresponding to an initial burst length but transitions to a low level when data corresponding to the word boundary is output, informing the system that the data is invalid data. The ready signal RDY transitions to a high level from outputting data of a second burst length BL and are maintained at the high level until the burst read operation is ended.

FIG. 1 is a timing diagram illustrating levels of a ready signal RDY and a wordline boundary generated at a burst read operation of the conventional memory device. Specifically, FIG. 1 shows a ready signal RDY indicating a word boundary existing in four words that are initially output when a burst start address A0 is given as a start address group.

If an address valid signal nAVD is synchronized with a rising edge of a clock signal CLK while being in a low level, a memory device enters a burst read mode. An input address A0 is synchronized with an external clock to successively conduct the burst read operation. Data are continuously output during an initial read period where access is performed for a cell corresponding to burst start address A0. The initial read period means a period from a low level of a valid signal nAVD and a rising edge of a clock signal associated with the output time of the initial data. Therefore during the initial read period, a ready signal RDY is maintained for a time T1 to inform the system that the data is invalid. After the initial read period, data are continuously sensed and output to conduct the burst read operation. However, 4-word data (under the premise that BL=4), has only three valid words because the start address group is 4N+1. Among the initial four words that are successively output, the three valid words are 1_2, 1_3, and 1_4. Output word 1_4 is dummy data among the words output by means of the initial read operation. Accordingly the memory device enables the ready signal RDY to transition to a low level during a clock cycle T2 where the last word output among the initially output words informs, the system that the data is invalid.

As described above, during one burst read mode, there are two low level periods of the ready signal RDY for informing the system that data are invalid data of the initial read period T1 and a word boundary period T2. Since the system must check a word boundary through the ready signal RDY each time entering a burst read mode, it must sense a second low period T2 of the ready signal RDY. The system must sense a length and a position of the second low level T2 of the ready signal RDY to receive output burst data without error.

In the burst read mode, the system must sense a low level of the ready signal RDY twice. Thus, the system may encounter the damage of hardware or software for setting an interrupt which results from twice ready signal RDY.

SUMMARY OF THE INVENTION

Exemplary embodiments of the present invention are directed to semiconductor memory device conducting a burst read operation. In an exemplary embodiment, the semiconductor memory device may include a memory cell array; a sense amplifier group configured for sequentially sensing and amplifying data stored in the memory cell array and a latch circuit configured for latching sensed data of the sense amplifier group and outputting the sensed data in response to a dump signal. The latch circuit includes a first latch circuit for latching the sensed data and a second latch circuit for repeatedly latching data of the first latch the sensed data and second A burst mode control unit is configured to detect the length of the invalid data included in the sensed data and controls the generation of the dump signal according to the detection result to sequentially output only valid data from the sensed data. By utilizing the burst read operation, the number of interrupts transferred from the memory device decreases thus alleviating system loading.

DESCRIPTION OF EMBODIMENTS

Figure 1:
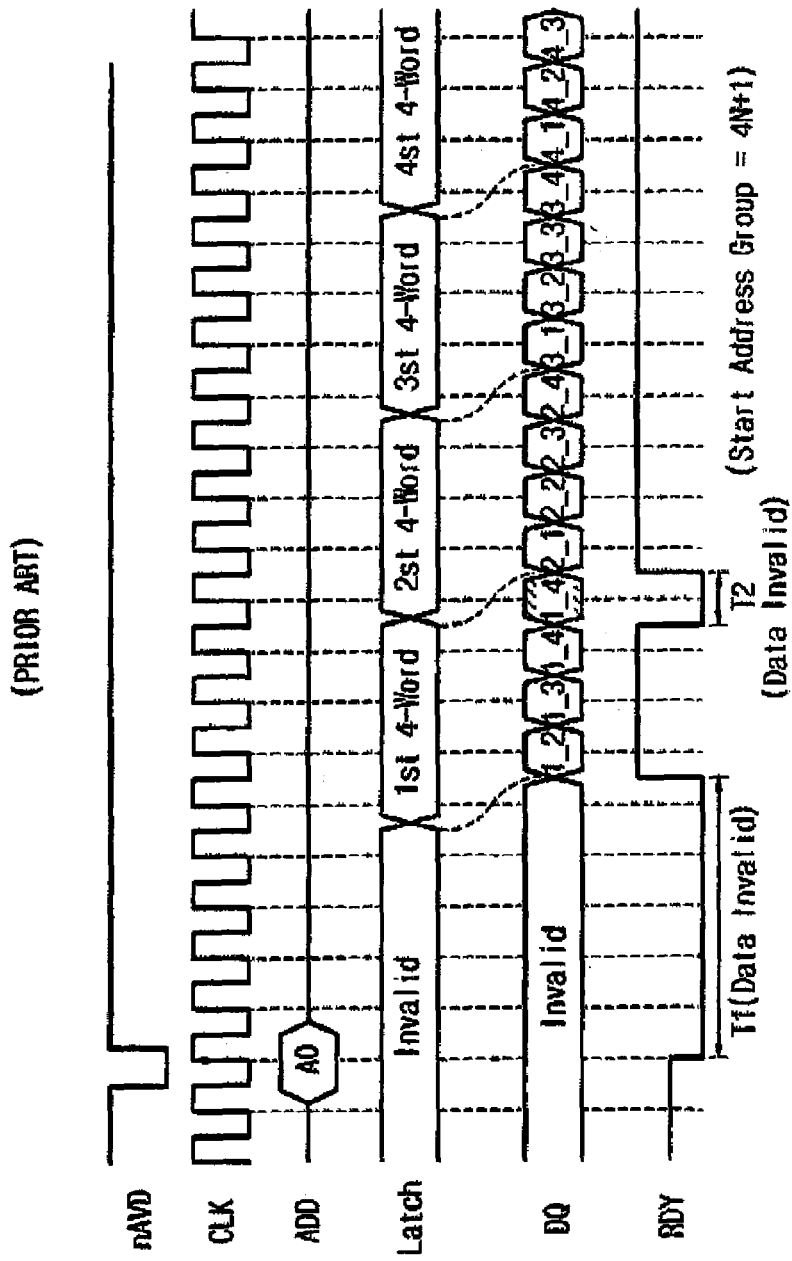
FIG. 1 is a timing diagram illustrating an output of a ready signal RDY during a conventional read operation.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

Figure 2:
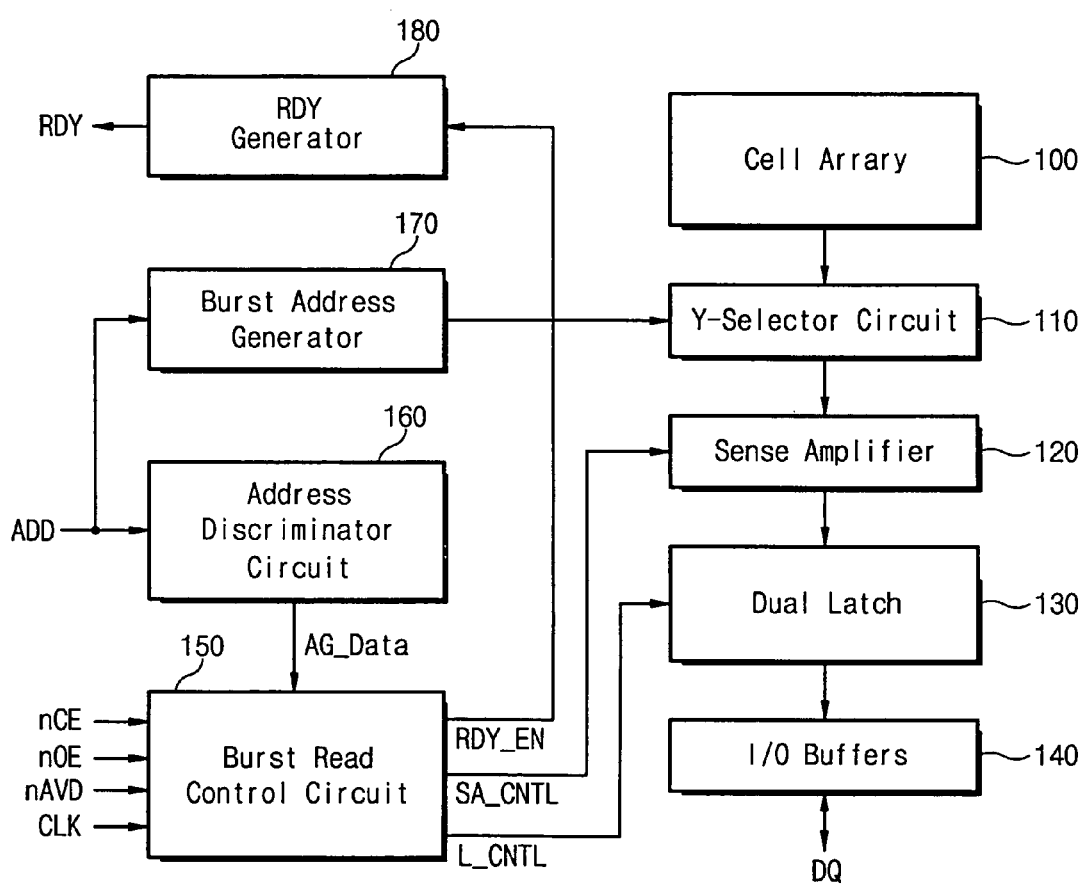
FIG. 2 is a block diagram of a configuration for generating a ready signal RDY according to the present invention.

FIG. 2 illustrates a flash memory device according to the present invention. A cell array 100 includes a plurality of NOR flash memory cells. Generally, a cell array of a NOR flash memory is configured in which a plurality of memory cells are connected in parallel to one bitline. During a read operation, a read voltage Vread (about 5 volts) is applied to a wordline and a bias voltage of about 1 volt is applied to a bitline. Whether a selected cell is an ON or OFF is determined by the intensity of current flowing along a bitline. A sense amplifier 120 senses data through a bitline as described below.

A Y-selector circuit 110 connects bitlines with sense amplifier 120 corresponding to an address during a read operation. During a burst read operation, a burst address is internally counted with reference to an externally input burst start address. Y-selector circuit 110 selects bitlines sequentially in response to this burst address such that stored data in all the memory cells included in a wordline selected by the row address are continuously sensed by sense amplifier 120.

The sense amplifier 120 senses the signal corresponding to the selected bitline to determine whether a selected cell is ON or OFF. Alternatively, in case of a multi-level cell (MLC), the sense amplifier 120 senses a signal corresponding to a position of a threshold voltage based on a program state to determine whether the cell is ON or OFF. The number of sense amplifiers 120 provided corresponds to four words per sector of cell array 100. General settings (e.g., burst length) of the burst read operation are determined according to the number of sense amplifiers 120 provided per sector of cell array 100. The sense signal associated with a cell is stored as data by means of dual latch 130. The dual latch 130 adjusts the output time of valid data included in four words initially output to a low level period (or disable period) of the ready signal RDY. A conventional dual latch includes a one-stage latch circuit, transmitting sensing data from a sense amplifier directly to an output port. In order to support a burst read mode, a one-stage latch must latch and output sensed data continuously. This is similar to initial burst data where a word boundary is initially output by an initial read operation. Therefore among 4-word data sensed by sense amplifier 120 through an initial read operation, valid data corresponding to the word boundary are output successively once predetermined valid data are output.

Dual latch 130 conducts a first latch operation and a second latch operation. Data sensed by sense amplifier 120 are latched during the first latch operation, and the latched data are additionally latched during the second latch operation. Such a dual latch operation latches sensed data and transmits only valid data among the initial burst data to an output port, which continues after an initial read operation. In other words, 4-word data latched by one latch must be output fast to continuously latch currently sensed 4-word data. Under this condition, it is difficult to manage initial 4-word data to be output by an initial read operation. The dual latch 130 outputs only valid data with output time delay as long as a clock, corresponding to a word boundary after latching 4-word data sensed by sense amplifier 120, is controlled by means of a burst read control circuit 150.

An input/output buffer 140 serves as a data input/output circuit port of the memory device. An exemplary structure is an x16 in which data of 1-word size is input/output for one clock cycle. A burst read control circuit 150 controls general components of the memory device in which a clock signal CLK and a valid address signal nAVD automatically operates under a burst read mode. When the valid address signal nAVD reaches a rising edge of clock signal CLK at a low level period, the memory device automatically enters the burst read mode. Burst read control circuit 150 detects two least significant bits (LSBs) of a burst start address synchronized with the rising edge to receive start address group data AG_DATA. The burst read control circuit 150 receives the start address group data AG_DATA which controls a ready signal generator 180 to output ready signal RDY in a low level in a time required for an initial read operation. In addition, burst read control circuit 150 controls signal generator 180 when the initial burst data is output at a low level period of ready signal RDY. Due to the operation of the burst read control circuit 150, ready signal RDY has only one low level period in the burst read mode. Further, burst read control circuit 150 generates a latch control signal L_CNTL which references the start address group data AG_DATA. The latch control signal L_CNTL is used to control the output time of dual latch 130 and includes L1_EN, L2_EN, and DUMP signal that will be described in FIG. 3.

An address discriminator circuit 160 fetches two LSBs of an input burst start address ADD, discriminating an address group to which a burst start address belongs. An address group is an address accessed initially in a burst read mode. Thus, the length of a word boundary as well as the length of a low level period of the ready signal RDY is determined based on the address group. For example, if the LSB of a burst start address is [00], [01], [10], and [11], the burst start address belongs to a 4N group, a 4N+1 group, a 4N+2 group, and a 4N+3 group, respectively. The address discriminator circuit 160 detects two LSBs of an external address ADD to transmit the detection result to burst read control circuit 150. The address discriminator circuit 160 receives the two LSBs of the external address ADD and transmits start address group data AG_DATA to the burst read control circuit 150. The address discriminator circuit 160 may be a comparator or a decoder circuit. It will be understood by those skilled in the art that the burst read control circuit 150 and the address discriminator circuit 160 may comprise a burst mode controller or a burst mode controller in combination with a ready signal generator 180.

A burst address generator 170 successively senses addresses of a memory cell to be output from a burst start address ADD and counts up the sensed address to internally generate burst addresses. Accordingly in a burst mode, addresses are automatically generated after inputting only an initial input burst start address. As a result, data may be continuously read with only inputting the initially burst start address. Ready signal generator 180 generates a ready signal RDY to output pin RDY in response to an RDY enable signal (RDY_EN) of burst read control circuit 150. In the burst read mode, a low level period of the ready signal RDY generated during an initial read period extends the output time of valid data from the initial burst data. This setting results in one low level period per burst mode. As a result, the generation number of a second low-level ready signal RDY informing a system of a word boundary decreases to alleviate load of the system.

In this manner, burst read control circuit 150 senses an address group to which a burst start address belongs in a burst mode to determine the number of clocks corresponding to the width of the word boundary. The burst read control circuit 150 senses data corresponding to input addresses and latches the sensed data through a dual latch structure, thereby controlling a ready signal RDY to transition to a low level only in a burst read mode once per unit.

Figure 3:
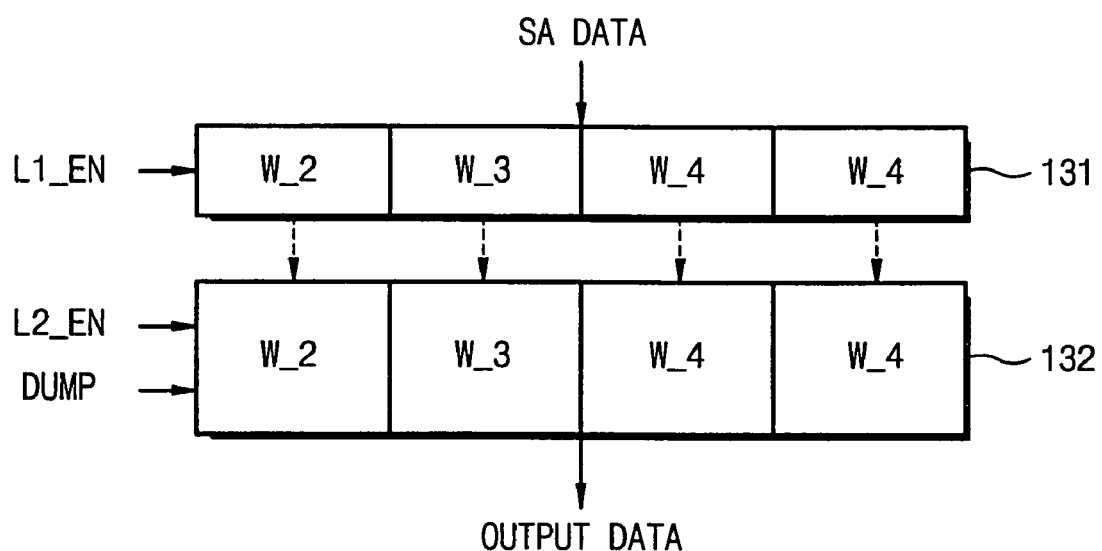
FIG. 3 is a block diagram of a dual latch illustrated in FIG. 2.

FIG. 3 is a block diagram of the dual latch 130 shown in FIG. 2. The dual latch 130 outputs a signal sensed by sense amplifier 120 through two-step latch operations. The two-step latch operations make it possible to easily control the output of initial data (burst unit data including a word boundary) latched by an initial read operation. The output time of the initial data may be controlled to remove the output of a word boundary generated in a burst read mode. Thus, a low level period of the ready signal RDY generated from a word boundary may be blocked to alleviate interrupt-load on the system.

A first latch 131 latches sensing data SA_Data transmitted from sense amplifier 120 in response to a first latch enable signal L1_EN output from burst read control circuit 150.

FIG. 3 illustrates the case where a start address group is 4N+1 and initial data is sensed by an initial read operation that includes 3-word valid data W_2, W_3, and W_4 and rightmost invalid data W_4. Second latch 132 copies the initial data stored in first latch 131 during a first clock cycle. The copy operation is conducted in response to a second latch enable signal L2_EN output from burst read control circuit 150. The copy data are sequentially output in response to a DUMP signal. When the initial data are output, burst read control circuit 150 recognizes the length of invalid data sensed from the burst start address already input from an external source. Accordingly, in the 4N+1 address group the signal DUMP is output with 1 clock delay. Since second latch 132 outputs after the 1 clock delay from the time when the latch operation ends, valid data W_4 of the rightmost latch stage of second latch 132 is not outputted. Such a control operation of second latch 132 is applied only to 4-word data (initial data) sensed by an initial read operation. Burst-unit 4-word data, sensed after the initial data, transmits data from first latch 131 to an output port.

In this manner, the memory device removes the output of word boundaries included in the initial data because dual latch 130 controls the output of the initial data. However, the output time of valid data included in the initial data is delayed as long as the number of clocks corresponds to the word boundaries. Due to the configuration and control of the output port, an initial read period T1' and period T2' are successively generated within a low level of ready signal RDY and a delay exists in outputting valid data in the T2' period. As a result, the low level period of ready signal RDY may be limited (e.g. to only one time) by means of the dual latch configuration.

Figure 4A:
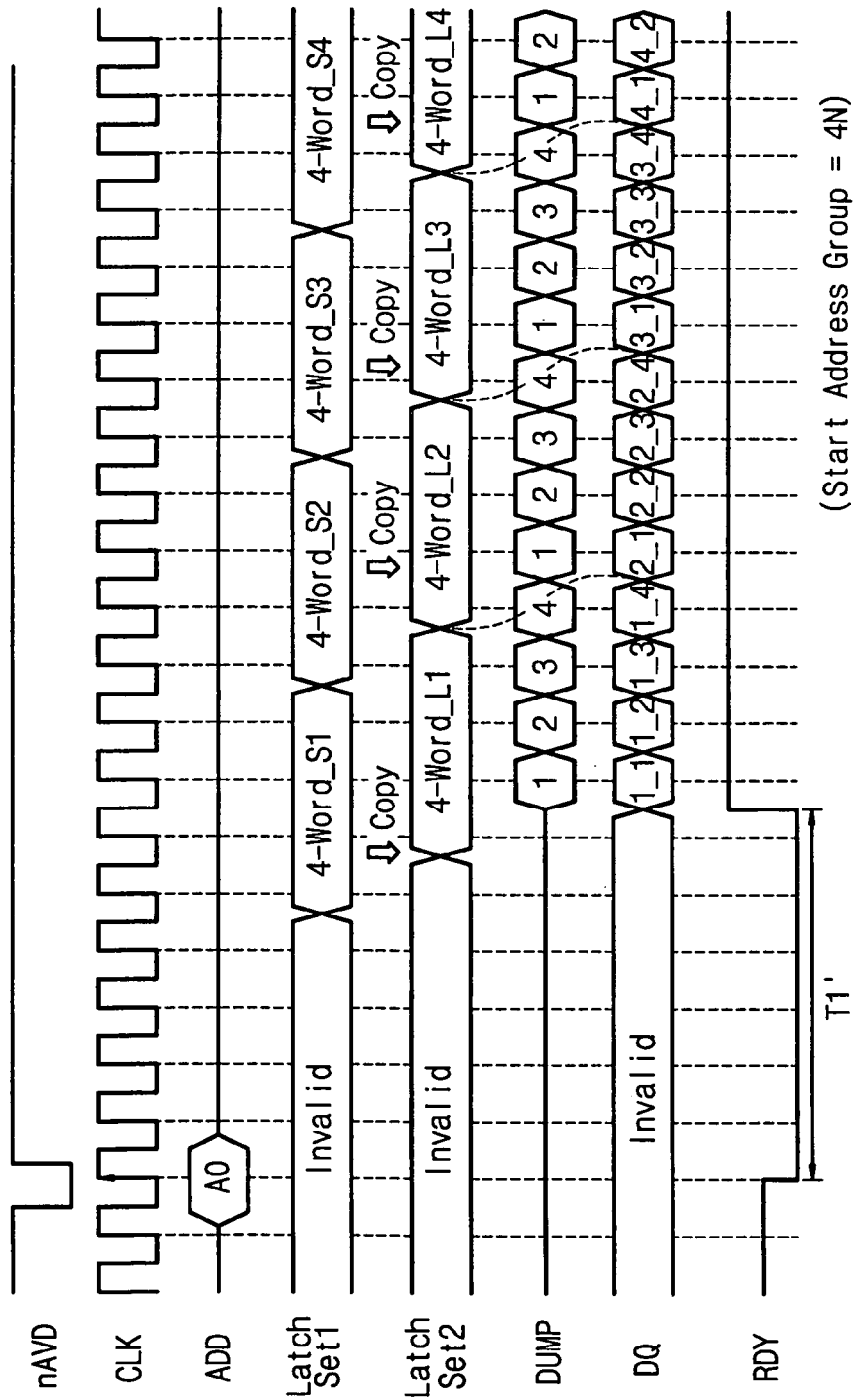
FIG. 4A is a timing diagram of a sync read operation when a start address group is 4N.

FIGS. 4A-4D illustrate timing diagrams for an output of a ready signal RDY in accordance with an embodiment of the present invention. The timing diagrams illustrate data output DQ and an output of ready signal RD where a burst start address belongs to address groups 4N, 4N+1, 4N+2, and 4N+3, respectively. In particular, FIG. 4A is a timing diagram where a burst start address A0 belongs to address group 4N. When an address valid signal nAVD is synchronized with a rising edge of a clock signal CLK in a low level period to input a burst start address A0, a memory device enters a burst read mode. Burst read control circuit 150 receives information on an address group to which the burst start address A0 belongs, from address discriminator circuit 160. The burst read control circuit 150 senses for valid data through an internal address generated from a burst start address during an initial read operation to latch first latch 131 and second latch 132. There is no invalid data among the initial 4-word data transmitted to second latch 132. Thus, burst read control circuit 150 transmits DUMP signal to sequentially output all word-sized latches of second latch 132. Namely, the DUMP signal is transmitted to (1, 2, 3, and 4) in synchronization with a clock signal CLK to output 4-word valid data. The ready signal RDY is output low during an initial read period T1'. When first word 1_1 is outputted, ready signal RDY transitions to a high level. The ready signal RDY is output low only during the initial read period T1', and there is no additional low level period based on a word boundary. Thus, there is no additional low level period of ready signal RDY when an address group to which a burst start address belongs is 4N.

Figure 4B:
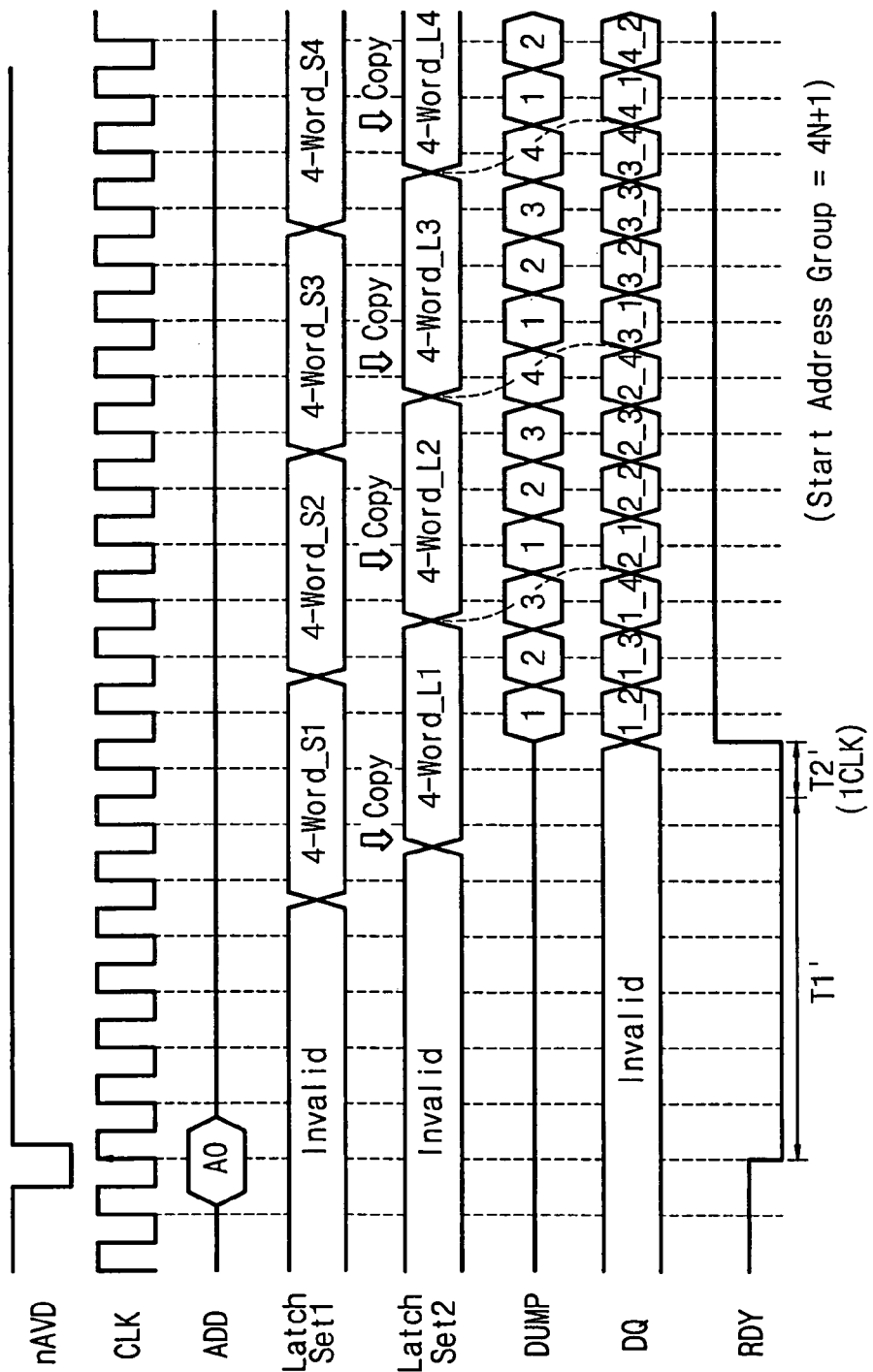
FIG. 4B is a timing diagram of a sync read operation when a start address group is 4N+1.

FIG. 4B is a timing diagram where a burst start address A0 belongs to address group 4N+1. When a burst star signal A0 belongs to start address group 4N+1, a low level period of ready signal RDY increases by a clock cycle T2'. This corresponds to a word boundary of output data from second latch 132 which latches initial data including 1 word-sized invalid data. Burst read control circuit 150 generates DUMP signal (delay, 1, 2, and 3) at the output period of initial data output from second latch 132 with the delay of one clock. Simultaneously, burst read control circuit 150 controls ready signal RDY such that the ready signal RDY is output low as long as period T2' corresponds to one clock cycle. Although a word boundary exists internally, the output of invalid data may be blocked through output control of second latch 132. As a result, the ready signal for informing the output of invalid data may be outputted with a one-time low level.

Figure 4C:
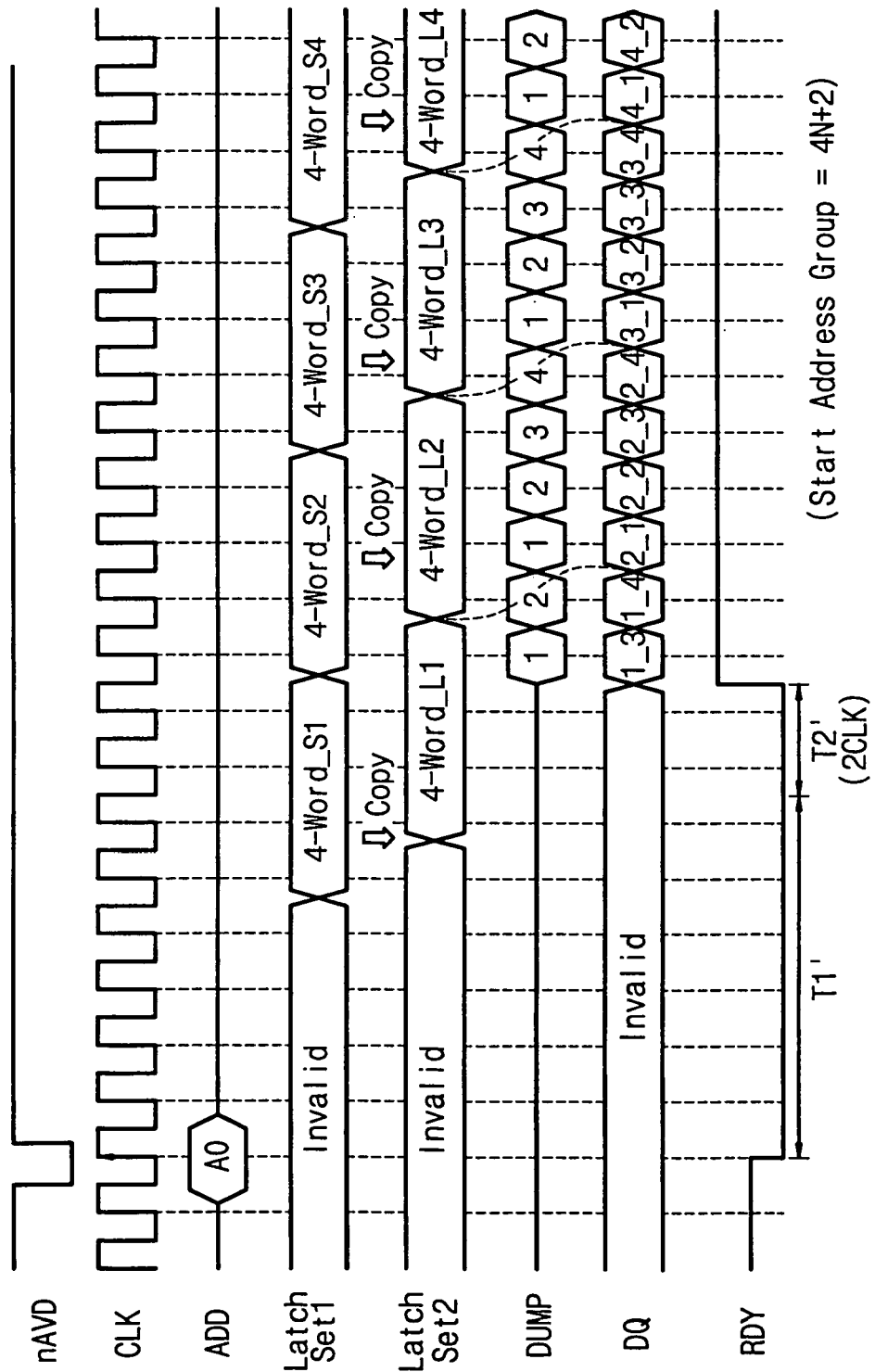
FIG. 4C is a timing diagram of a sync read operation when a start address group is 4N+2.
Figure 4D:
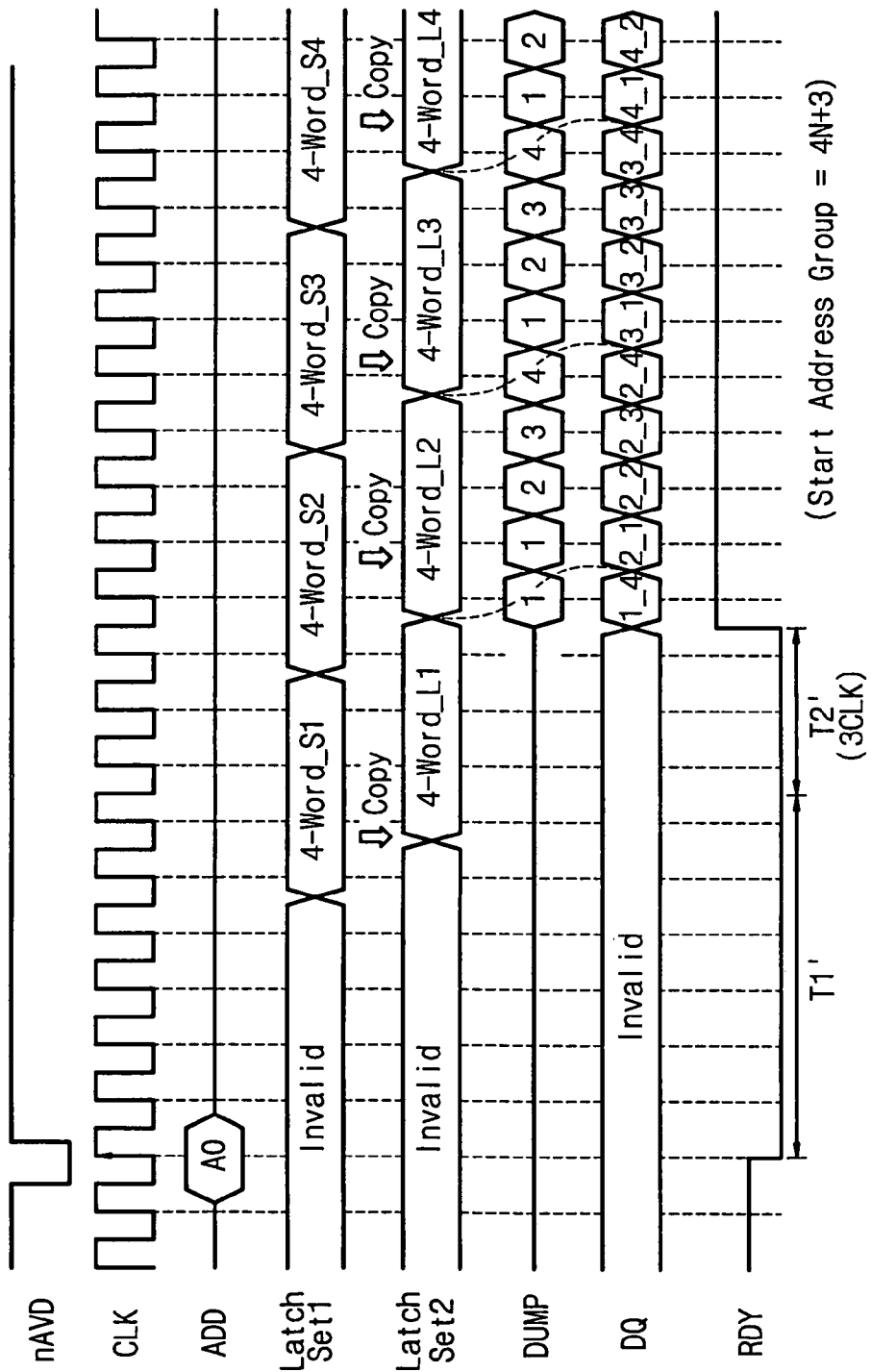
FIG. 4D is a timing diagram of sync read operation when a start address group is 4N+3.

FIG. 4C and FIG. 4D are timing diagrams where a burst start address is 4N+2 and 4N+3, respectively. Under each of these cases, low level periods of a ready signal RDY are successively output as an initial read period T1' and the number T2' of clocks where the output of valid data is delayed. In particular, FIG. 4C illustrates a clock corresponding to an invalid word included in initial data 2 clock (2CLK). FIG. 4D shows an invalid word of 3 clock (3CLK). In each of these cases, burst read control circuit 150 outputs only valid data with the delay of invalid data outputted at time T2' through a DUMP signal of second latch 132. During a delayed period, ready signal RDY is maintained at a low level. Thus, a low level period of ready signal RDY includes an initial read time T1' and a delayed time T2' until valid data is outputted. As a result, the number of interrupts transferred to a system from a memory device decreases to alleviate system loading. Such a word boundary output control based on an initial read is done by means of a second dual latch 132.

As shown in the above-described timing diagrams, a dual latch includes first latch 131 for latching a sensing signal of a sense amplifier and a second latch 132 for repeatedly latching data of first latch 131 such that first latch 131 successively senses burst data. A ready signal RDY transitions to a low level once at an output period of burst unit data. Thus, a system checks a low level period of the ready signal RDY to alleviate interrupt loads for detecting invalid data caused by a word boundary.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A semiconductor memory device comprising:
   a memory cell array;
   a sense amplifier configured for sequentially sensing and amplifying data stored in said memory cell array;
   a latch circuit configured for latching sensed data of said sense amplifier and outputting the sensed data in response to a dump signal; and
   a burst mode control unit configured for detecting a length of invalid data within said sensed data, said control unit controlling generation of said dump signal according to said length of invalid data to sequentially output only valid data from said sensed data.

2. The semiconductor memory device of claim 1, wherein said latch circuit comprises:
   a first latch configured for latching the sensed data; and
   a second latch configured for re-latching the latched data from said first latch and outputting the sensed data in response to said dump signal.

3. The semiconductor memory device of claim 2, wherein said sensed data comprises burst-length unit data sensed initially at a burst read operation after being latched.

4. The semiconductor memory device of claim 3, wherein the sensed data includes valid and invalid data.

5. The semiconductor memory device of claim 4, wherein the invalid data corresponds to a word boundary.

6. The semiconductor memory device of claim 2, wherein the second latch sequentially outputs valid data with a delay corresponding to the burst length of said invalid data in response to said dump signal.

7. The semiconductor memory device of claim 1, wherein said burst mode control unit comprises:
   an address discriminator circuit configured for sensing a burst length of said invalid data from said burst start address;
   a burst read control circuit communicating with said address discriminator circuit configured to control said dump signal at a point in time associated with said burst length of said invalid data; and
   a ready signal generator configured for generating a ready signal in response to said burst read control circuit.

8. The semiconductor memory device of claim 7, wherein said burst read control circuit controls said ready signal generator such that said ready signal is maintained at a disable state until the output of valid data from said memory cell array.

9. The semiconductor memory device of claim 1, wherein the memory cell array is a NOR-type cell array.

10. The semiconductor memory device of claim 1 further comprising:
    a ready signal generator communicating with said burst mode control unit and configured to generate a ready signal which is maintained at a disable state until the output of said valid data.

11. The semiconductor memory device of claim 10, wherein the burst read operation includes a successive burst read operation where data of burst length are output at least once.

12. A method for outputting, in a burst mode, data of a semiconductor memory device, the method comprising:
    sensing data stored in a memory cell array;
    detecting a length of invalid data included in a length of burst data output initially from said memory cell array based on a burst start address;
    storing the sensed data in a latch circuit; and
    controlling the latch circuit to sequentially output only valid data among the sensed data based on the length of invalid data.

13. The method of claim 12, wherein a ready signal is maintained at a disabled state until the output of said valid data.

14. The method of claim 12, wherein the latch circuit comprises a first latch and a second latch.

15. The method of claim 14, wherein storing the sensed data in a latch circuit comprises:
    latching the sensed data; and
    repeatedly latching the latched data.

16. The method of claim 15, wherein controlling the latch circuit further comprises controlling the second latch during output of said valid data.

* * * * *